(12) United States Patent
Li et al.

(10) Patent No.: US 11,018,196 B2
(45) Date of Patent: May 25, 2021

(54) DISPLAY SUBSTRATE AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Jiewei Li, Beijing (CN); Xianjiang Xiong, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 494 days.

(21) Appl. No.: 15/772,977

(22) PCT Filed: Sep. 28, 2017

(86) PCT No.: PCT/CN2017/103941
§ 371 (c)(1),
(2) Date: May 2, 2018

(87) PCT Pub. No.: WO2018/166176
PCT Pub. Date: Sep. 20, 2018

(65) Prior Publication Data
US 2020/0258949 A1  Aug. 13, 2020

(30) Foreign Application Priority Data

Mar. 15, 2017 (CN) .......................... 201710152992.3

(51) Int. Cl.
*H01L 27/32* (2006.01)
*H01L 51/50* (2006.01)

(52) U.S. Cl.
CPC ........ *H01L 27/3216* (2013.01); *H01L 51/506* (2013.01); *H01L 51/5088* (2013.01)

(58) Field of Classification Search
CPC ............. H01L 51/5088; H01L 27/3216; H01L 51/506; H01L 27/3211
See application file for complete search history.

(56) References Cited

U.S. PATENT DOCUMENTS

2009/0146929 A1* 6/2009 Kim .................... H01L 27/3211
                                                                    345/77
2009/0262258 A1  10/2009 Taneda et al.
(Continued)

FOREIGN PATENT DOCUMENTS

CN       102270655 A    12/2011
CN       102723351 B     2/2015
(Continued)

OTHER PUBLICATIONS

International Search Report and Written Opinion for Application No. PCT/CN2017/103941, dated Jan. 10, 2018, 13 Pages.

*Primary Examiner* — Dung A. Le
(74) *Attorney, Agent, or Firm* — Brooks Kushman P.C.

(57) ABSTRACT

The present disclosure provides a display substrate and a display device. The display substrate comprises a base substrate and an anode, an organic light-emitting layer and a cathode formed on the base substrate sequentially, wherein the display substrate further comprises a plurality of functional patterns formed between the organic light-emitting layer and the anode, the plurality of functional patterns is divided into different types based on colors of a plurality of sub-pixels, and each type of the plurality of functional patterns is disposed in a region of the sub-pixel with a color corresponding to the type; the plurality of sub-pixels with different colors has different driving voltages, and a resistance value of each type of the plurality of the functional (Continued)

| 4 | | | | | |
|---|---|---|---|---|---|
| 8 | | | | | |
| 7 | | | | | |
| R | G | B | R | G | B |
| 6 | | | | | |
| 61* | 62* | 63* | 61* | 62* | 63* |
| 5 | | | | | |
| 2 | | | | | |
| 1 | | | | | |

← 3

← 6* patterns in a direction perpendicular to the organic light-emitting layer is controlled to decrease as the driving voltage of the sub-pixel with the color corresponding to the type increases.

20 Claims, 1 Drawing Sheet

(56) References Cited

U.S. PATENT DOCUMENTS

| | | | |
|---|---|---|---|
| 2011/0121346 A1* | 5/2011 | Yamada | H05B 33/24 |
| | | | 257/98 |
| 2011/0297977 A1 | 12/2011 | Kajimoto | |
| 2012/0062130 A1 | 3/2012 | Ono | |
| 2012/0228603 A1 | 9/2012 | Nakamura | |
| 2013/0181967 A1 | 7/2013 | Lee et al. | |
| 2014/0291647 A1* | 10/2014 | Suzuki | H01L 51/5012 |
| | | | 257/40 |
| 2017/0194385 A1* | 7/2017 | Jung | H01L 51/5056 |
| 2017/0194386 A1 | 7/2017 | Xiong et al. | |
| 2018/0190732 A1* | 7/2018 | Lee | H01L 51/5064 |

FOREIGN PATENT DOCUMENTS

| | | |
|---|---|---|
| CN | 102668706 B | 3/2015 |
| CN | 105428391 A | 3/2016 |
| CN | 106960862 A | 7/2017 |
| WO | 2010137298 A1 | 12/2010 |

* cited by examiner

DISPLAY SUBSTRATE AND DISPLAY DEVICE

CROSS-REFERENCE TO RELATED APPLICATION APPLICATIONS

This application is the U.S. national phase of PCT Application No. PCT/CN2017/103941 filed on Sep. 28, 2017, which claims priority to Chinese Patent Application No. 201710152992.3 filed on Mar. 15, 2017, which are incorporated herein by reference in their entireties.

TECHNICAL FIELD

The present disclosure relates to the field of display, in particular to a display substrate and a display device.

BACKGROUND

In the existing OLED display field, a hole transport layer is usually p-type doped, so as to reduce an interface barrier between an anode and an organic layer. This may lead to increased hole injection capability of the OLED as well as reduced driving voltage and power consumption.

However, while reducing the driving voltage, the p-type doping causes a significant decrease in a transverse resistance of the pattern layer. Therefore, transverse current is easily generated after the OLED is energized. As a result, when a sub-pixel having a larger longitudinal resistance is lightened, its current tends to flow transversely, thereby enabling adjacent sub-pixels with smaller longitudinal resistances to be also lightened at the same time. This phenomenon is known as sub-pixel sneak lightening, and appears macroscopically as pixel crosstalk. This can lead to reduced color purity, increased power consumption, reduced display quality and other adverse consequences.

SUMMARY

An object of the present disclosure is to provide an OLED display substrate and a display device capable of solving the problem of pixel crosstalk of the existing display devices.

In one aspect, an embodiment of the present disclosure provides a display substrate, which comprises a base substrate and an anode, an organic light-emitting layer and a cathode formed on the base substrate sequentially, wherein the display substrate further comprises a plurality of functional patterns formed between the organic light-emitting layer and the anode, the plurality of functional patterns is divided into different types based on colors of a plurality of sub-pixels, and each type of the plurality of functional patterns is disposed in a region of the sub-pixel with a color corresponding to the type; and the plurality of sub-pixels with different colors has different driving voltages, and a resistance value of each type of the plurality of the functional patterns in a direction perpendicular to the organic light-emitting layer is controlled to decrease as the driving voltage of the sub-pixel with the color corresponding to the type increases.

Optionally, the plurality of sub-pixels with different colors comprises a first color sub-pixel and a second color sub-pixel, the plurality of functional patterns comprises a first functional pattern corresponding to the first color sub-pixel and a second functional pattern corresponding to the second color sub-pixel, the driving voltage of the first color sub-pixel is higher than that of the second color sub-pixel, and a resistance value of the first functional pattern in the direction perpendicular to the organic light-emitting layer is less than that of the second functional pattern in the direction perpendicular to the organic light-emitting layer.

Optionally, the resistance values of the first and second functional patterns in the direction perpendicular to the organic light-emitting layer are chosen so that an actual driving voltage of the first color sub-pixel is close to that of the second color sub-pixel.

Optionally, a ratio of the actual driving voltage of the first color sub-pixel to that of the second color sub-pixel is between 0.895 and 1.015.

Optionally, the functional patterns are p-doped functional patterns, and a material doping concentration of the first functional pattern is higher than that of the second functional pattern.

Optionally, the sub-pixels comprise a red sub-pixel, a green sub-pixel and a blue sub-pixel, wherein a driving voltage of the red sub-pixel is higher than that of the green sub-pixel, and lower than that of the blue sub-pixel.

Optionally, the functional patterns are p-doped hole injection layers formed between the organic light-emitting layer and the anode, and comprise a first p-doped hole injection layer corresponding to the red sub-pixel, a second p-doped hole injection layer corresponding to the green sub-pixel and a third p-doped hole injection layer corresponding to the blue sub-pixel; and a material doping concentration of the first p-doped hole injection layer is lower than that of the third p-doped hole injection layer, and higher than that of the second p-doped hole injection layer.

Optionally, the material doping concentrations of the p-doped hole injection layers are less than or equal to 5% by weight.

Optionally, the material for forming the p-doped hole injection layers comprises one or more selected from the group consisting of rubrene-based compounds, quinoline aluminum-based compounds, copper phthalocyanine-based compounds, NPB-based compounds, TCB-based compounds, TNATA-based compounds, TPD-based compounds, and CBP-based compounds.

Optionally, a dopant for the p-doped hole injection layers comprises one or more selected from the group consisting of organic cyanogen compounds, C60 and its derivatives, molybdenum oxide, vanadium oxide, and zirconia.

Optionally, the first functional pattern has a thickness less than that of the second functional pattern.

Optionally, the sub-pixels comprise a red sub-pixel, a green sub-pixel and a blue sub-pixel, wherein a driving voltage of the red sub-pixel is higher than that of the green sub-pixel, and lower than that of the blue sub-pixel.

Optionally, the display substrate comprises a main hole transport layer formed between the organic light-emitting layer and the anode, and an auxiliary hole transport layer formed between the main hole transport layer and the anode; the functional patterns are the auxiliary hole transport layer and comprise a first auxiliary hole transport layer corresponding to the red sub-pixel, a second auxiliary hole transport layer corresponding to the green sub-pixel, and a third auxiliary hole transport layer corresponding to the blue sub-pixel; and the first auxiliary hole transport layer has a thickness greater than that of the third auxiliary hole transport layer, and less than that of the second auxiliary hole transport layer.

Optionally, the auxiliary hole transport layer has a thickness less than or equal to 50 Å.

Optionally, the display substrate further comprises a hole injection layer formed between the auxiliary hole transport layer and the anode, and a material doping concentration of the auxiliary hole transport layer is lower than that of the main hole transport layer or of the hole injection layer.

In another aspect, the present disclosure further provides a display device comprising the display substrate described according to any embodiment above.

At least one of the technical solutions of the present disclosure has the following advantageous effects.

In the present disclosure, by providing the functional patterns, the longitudinal resistances in the regions of the sub-pixels are adjusted so that the region of the sub-pixel having a relatively high driving voltage is provided with the functional pattern with a relatively small longitudinal resistance, while the region of the sub-pixel having a relatively low driving voltage is provided with the functional pattern with a relatively large longitudinal resistance, thereby making the driving voltages actually applied to the sub-pixels with different colors maintained at a relatively close level. Moreover, by adjusting the longitudinal resistances of the sub-pixel regions in the present disclosure, it is possible to effectively control transverse current leakage to adjacent sub-pixel regions and thus effectively improve the problem of pixel crosstalk.

DETAILED DESCRIPTION

In order to make the technical problem to be solved, technical solutions and advantages of the present disclosure more apparent, the present disclosure will be described in detail in conjunction with the specific embodiments and the drawings.

In order to solve the problem of pixel crosstalk due to the easy generation of transverse leakage current in the pixel regions of the existing display devices, the present disclosure provides the following technical solutions.

Figure 1:
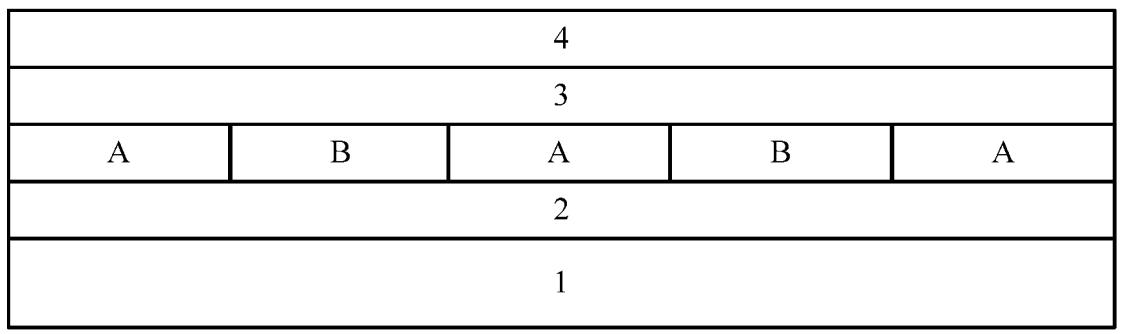
FIG. 1 is a structural schematic view of a display device according to the present disclosure.

In one aspect, an embodiment of the present disclosure provides a display substrate which includes a base substrate 1 and an anode 2, an organic light-emitting layer 3 and a cathode 4 formed on the base substrate 1 sequentially, as shown in FIG. 1.

The display substrate further includes a plurality of functional patterns formed between the organic light-emitting layer 3 and the anode 2, which is divided into different types A and B based on colors of a plurality of sub-pixels on the display substrate, and each type of the functional patterns A, B is disposed in a region of the sub-pixel with a color corresponding to the type.

The plurality of sub-pixels with different colors has different driving voltages, and a resistance value of each type of the functional patterns in a direction perpendicular to the organic light-emitting layer is controlled to decrease as the driving voltage of the sub-pixel with the color corresponding to the type increases.

Like common OLED display devices, the display substrate comprises a plurality of sub-pixels of different colors which is divided, but the sub-pixels with different colors have different driving voltages.

As shown in FIG. 1, the plurality of sub-pixels with different colors in this embodiment includes at least a first color sub-pixel and a second color sub-pixel. The plurality of functional patterns include a first functional pattern A corresponding to the first color sub-pixel and a second functional pattern B corresponding to the second color sub-pixel. When a driving voltage of the first color sub-pixel is higher than that of the second color sub-pixel, a resistance value of the first functional pattern A in a direction perpendicular to the organic light-emitting layer 3 is less than that of the second functional pattern B in the same direction. Optionally, the resistance values of the first and second functional patterns in the direction perpendicular to the organic light-emitting layer are set so that a driving voltage actually applied to the first color sub-pixel is close to that actually applied to the second color sub-pixel. Further alternatively, a ratio of the driving voltage actually applied to the first color sub-pixel to that actually applied to the second color sub-pixel is between 0.985 and 1.015. Preferably, the ratio of the driving voltage actually applied to the first color sub-pixel to that actually applied to the second color sub-pixel is about 1.

In the above embodiment of the present disclosure, the longitudinal resistances in the regions of the sub-pixels are adjusted by providing the functional patterns. The region of the sub-pixel having a relatively high driving voltage is correspondingly provided with the functional pattern with a relatively small longitudinal resistance, which makes it easier for current generated under a high driving voltage to flow longitudinally. In contrast, the region of the sub-pixel having a relatively low driving voltage is correspondingly provided with the functional pattern with a relatively large longitudinal resistance. Thus the leakage current in the transverse direction is reduced.

As can be seen from the above, this embodiment can not only maintain the driving voltages actually applied to the regions of the sub-pixels having different colors at a relatively close level, but also effectively control the leakage of transverse current to adjacent sub-pixel regions. Accordingly, the problem of pixel crosstalk of pictures is solved.

Hereinafter, how the longitudinal resistances of the sub-pixel regions are adjusted in the above embodiment will be further described in detail in conjunction with different specific embodiments.

First Embodiment

In the first embodiment, the longitudinal resistances of the regions of the sub-pixels with different colors may be adjusted by controlling material doping concentrations of the different types of the functional patterns.

As exemplary explanation, the functional patterns are each p-doped functional patterns in this embodiment.

Assuming that the driving voltage of the first color sub-pixel is higher than that of the second color sub-pixel, the material doping concentration of the first functional pattern corresponding to the first color sub-pixel is higher than that of the second functional pattern corresponding to the second color sub-pixel, so that the resistance value of the first functional pattern in the direction perpendicular to the organic light-emitting layer is less than that of the second functional pattern in the same direction. That is, the sub-pixel having a high driving voltage corresponds to a small longitudinal resistance value, thereby effectively reducing the leakage current flowing transversely.

Figure 2:
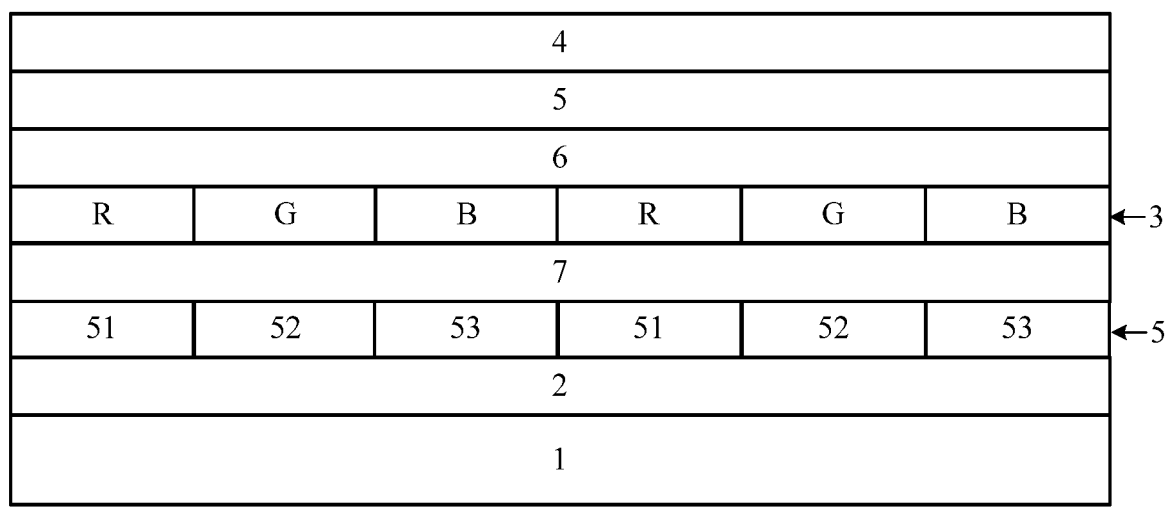
FIG. 2 is a structural schematic view of a display substrate according to a first embodiment of the present disclosure.

As shown in FIG. 2, the display substrate of the first embodiment includes a base substrate 1 and an anode 2, a hole injection layer 5, a hole transport layer 6, an organic light-emitting layer 3, an electron transport layer 7, an electron injection layer 8 and a cathode 4 formed on the base substrate 1 sequentially. The sub-pixels comprise a red sub-pixel R, a green sub-pixel G and a blue sub-pixel B, and their regions are divided in the organic light-emitting layer 3 the colors of the sub-pixels, as shown in FIG. 2.

In the first embodiment, the hole injection layer 5 (a commonly-used pattern layer) is also used as a functional pattern of the present disclosure. The hole injection layer 5 includes a first p-doped hole injection layer 51 corresponding to the red sub-pixel, a second p-doped hole injection layer 52 corresponding to the green sub-pixel, and a third p-doped hole injection layer 53 corresponding to the blue sub-pixel.

In this embodiment, the driving voltage of the red sub-pixel is higher than that of the green sub-pixel, and lower than that of the blue sub-pixel. Therefore, the material doping concentration of the first p-doped hole injection layer 51 is lower than that of the third p-doped hole injection layer 53, and higher than that of the second p-doped hole injection layer 52.

Practice has proven that in the first embodiment, one or more selected from the group consisting of rubrene-based compounds, quinoline aluminum-based compounds, copper phthalocyanine-based compounds, NPB-based compounds, TCB-based compounds, TNATA-based compounds, TPD-based compounds, and CBP-based compounds may be used to form the p-doped hole injection layers 51, 52 and 53. Furthermore, a dopant may include one or more selected from the group consisting of organic cyanogen compounds, C60 and its derivatives, molybdenum oxide, vanadium oxide, and zirconia, and the doping concentration thereof may be less than or equal to 5% by weight.

In specific implementation of the first embodiment, the sub-pixel with the highest driving voltage may be selected as a reference. The material doping concentrations of the p-doped hole injection layers corresponding to the three types of sub-pixels R, G, B are adjusted, so as to make the driving voltages actually applied to them tend to be consistent. In essence, the longitudinal resistances of the sub-pixels of the three colors are adjusted, and the transverse leakage current is effectively suppressed while sufficient hoe injection capability and low driving voltages are ensured. As a result, the problem of pixel crosstalk is improved.

Second Embodiment

In this second embodiment, the longitudinal resistances of the sub-pixels with different colors may be adjusted by controlling thicknesses of the different types of functional patterns.

As exemplary explanation, assuming that the driving voltage of the first color sub-pixel is higher than that of the second color sub-pixel, the thickness of the first functional pattern corresponding to the first color sub-pixel is less than that of the second functional pattern corresponding to the second color sub-pixel, so that the resistance value of the first functional pattern in the direction perpendicular to the organic light-emitting layer is less than that of the second functional pattern in the same direction. That is, the sub-pixel having a high driving voltage corresponds to a small longitudinal resistance value, thereby effectively reducing the leakage current flowing transversely.

Figure 3:
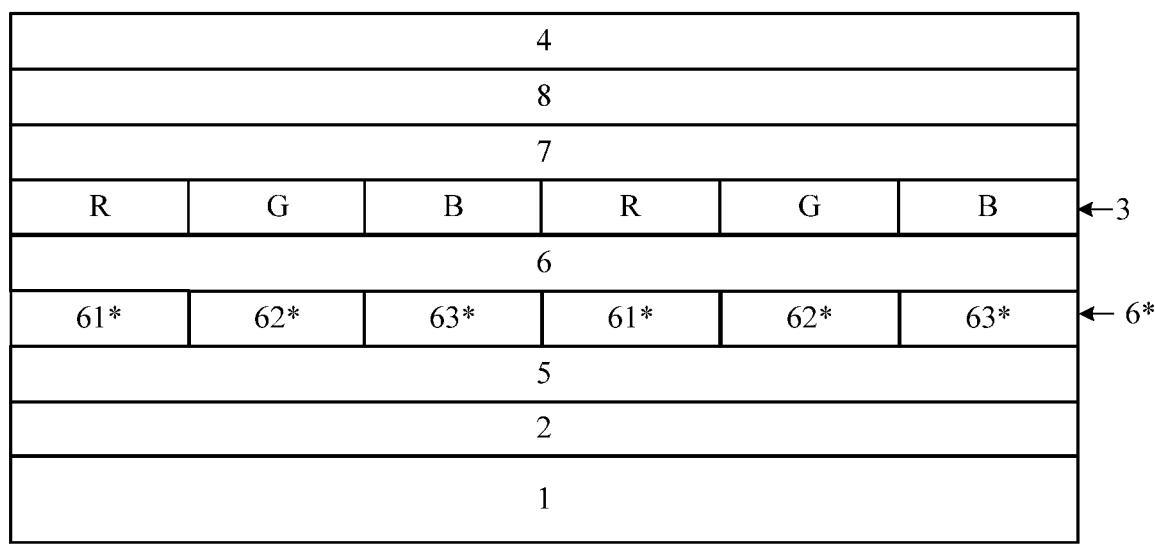
FIG. 3 is a structural schematic view of a display substrate according to a second embodiment of the present disclosure.

As shown in FIG. 3, the display substrate of the second embodiment includes a base substrate 1 and an anode 2, a hole injection layer 5, an auxiliary hole transport layer 6*, a main hole transport layer 6, an organic light-emitting layer 3, an electron transport layer 7, an electron injection layer 8 and a cathode 4 formed on the base substrate 1 sequentially. The sub-pixels comprise a red sub-pixel R, a green sub-pixel G and a blue sub-pixel B, and their regions are divided in the organic light-emitting layer 3 based on the colors of the sub-pixels, as shown in FIG. 3.

In the second embodiment, the auxiliary hole transport layer 6* is also used as a functional pattern of the present disclosure, and includes a first auxiliary hole transport layer 61* corresponding to the red sub-pixel, a second auxiliary hole transport layer 62* corresponding to the green sub-pixel, and a third auxiliary hole transport layer 63* corresponding to the blue sub-pixel.

In this embodiment, the driving voltage of the red pixels is higher than that of the green sub-pixel, and lower than that of the blue sub-pixel. Therefore, the thickness of the first auxiliary hole transport layer 61* is greater than that of the third auxiliary hole transport layer 63*, and less than that of the second auxiliary hole transport layer 62*.

Practice has proven that the auxiliary hole transport layer 6* in the second embodiment may be made of a low mobility material, such as PVK-based compounds and quinoline aluminum-based compounds, and its thickness may be less than or equal to 50 Å. Furthermore, a material doping concentration of the auxiliary hole transport layer 6* is preferably lower than that of the main hole transport layer 6 or of the hole injection layer 5, so as to achieve the effect of stable pixel driving.

In specific implementation of the second embodiment, the sub-pixel with the highest driving voltage may be selected as a reference. The thicknesses of the auxiliary hole transport layers 6 corresponding to the three types of sub-pixels R, G, B are adjusted, so as to make the driving voltages actually applied to them tend to be consistent. In essence, it is equivalent to the adjustment of the longitudinal resistances of the sub-pixels of the three colors, and achieves effective suppression of the transverse leakage current while ensuring sufficient hole injection capability and low driving voltages. As a result, the problem of pixel crosstalk is improved.

Thus, the solutions of the first and second embodiments only require slight modification of the manufacturing process of the existing substrate, and will not cause significant increase in the production cost. Furthermore, it is possible to further achieve the requirements of reduced driving voltages and power consumption. That is, it is possible to reduce the power consumption as much as possible while ensuring that at least one type of the sub-pixels is in an optimized low-power consumption state and the other sub-pixels meet the requirement that no pixel crosstalk occurs.

Also, it shall be noted that, the first and second embodiments described above are used to exemplarily explain the solutions of controlling the longitudinal resistances of the sub-pixels. As another feasible solution, the material doping concentrations and the thicknesses of the functional patterns can be controlled at the same time, so as to achieve the required resistances of the functional patterns in the direction perpendicular to the organic light-emitting layer, thereby controlling the resistances of the sub-pixels.

On the other hand, an embodiment of the present disclosure further provides a display device comprising the display substrate provided in the first embodiment or in the second embodiment as described above. Apparently, based on the design of the display substrate, the display device of this embodiment effectively solves the problem of pixel crosstalk, so that pictures with higher color purity can be displayed and user's experience is improved.

The above are optional embodiments of the present disclosure. It shall be indicated that several improvements and modifications made be made by a person having ordinary skills in the art without departing from the principle of the present disclosure, and such improvements and modifications should also be regarded as falling within the protection scope of the present disclosure.

What is claimed is:

1. A display substrate, comprising a base substrate and an anode, an organic light-emitting layer and a cathode formed on the base substrate sequentially,
wherein the display substrate further comprises a plurality of functional patterns formed between the organic light-emitting layer and the anode, the plurality of functional patterns is divided into different types based on colors of a plurality of sub-pixels, and each type of the plurality of functional patterns is disposed in a region of the sub-pixel with a color corresponding to the type;
wherein the plurality of sub-pixels with different colors has different driving voltages, and a resistance value of each type of the plurality of the functional patterns in a direction perpendicular to the organic light-emitting layer is controlled to decrease as the driving voltage of the sub-pixel with the color corresponding to the type increases; and
wherein the plurality of sub-pixels with different colors comprises a first color sub-pixel and a second color sub-pixel, the plurality of functional patterns comprises a first functional pattern corresponding to the first color sub-pixel and a second functional pattern corresponding to the second color sub-pixel, the driving voltage of the first color sub-pixel is higher than that of the second color sub-pixel, and a resistance value of the first functional pattern in the direction perpendicular to the organic light-emitting layer is less than that of the second functional pattern in the direction perpendicular to the organic light-emitting layer.

2. The display substrate according to claim 1, wherein the resistance values of the first and second functional patterns in the direction perpendicular to the organic light-emitting layer are set so that a driving voltage actually applied to the first color sub-pixel is close to that actually applied to the second color sub-pixel.

3. The display substrate according to claim 1, wherein a ratio of the driving voltage actually applied to the first color sub-pixel to that actually applied to the second color sub-pixel is between 0.985 and 1.015.

4. The display substrate according to claim 1, wherein the functional patterns are p-doped functional patterns, and a material doping concentration of the first functional pattern is higher than that of the second functional pattern.

5. The display substrate according to claim 1, wherein the sub-pixels comprise a red sub-pixel, a green sub-pixel and a blue sub-pixel, and a driving voltage of the red sub-pixel is higher than that of the green sub-pixel, and lower than that of the blue sub-pixel;
the functional patterns are p-doped hole injection layers formed between the organic light-emitting layer and the anode, and comprise a first p-doped hole injection layer corresponding to the red sub-pixel, a second p-doped hole injection layer corresponding to the green sub-pixel and a third p-doped hole injection layer corresponding to the blue sub-pixel; and
a material doping concentration of the first p-doped hole injection layer is lower than that of the third p-doped hole injection layer, and higher than that of the second p-doped hole injection layer.

6. The display substrate according to claim 5, wherein the material doping concentrations of the p-doped hole injection layers are less than or equal to 5% by weight.

7. The display substrate according to claim 5, wherein the material for forming the p-coped hole injection layers comprises one or more selected from the group consisting of rubrene-based compounds, quinoline aluminum-based compounds, copper phthalocyanine-based compounds, NPB-based compounds, TCB-based compounds, TNATA-based compounds, TPD-based compounds, and CBP-based compounds; and
a dopant for the p-doped hole injection layers comprises one or more selected from the group consisting of organic cyanogen compounds, C60 and its derivatives, molybdenum oxide, vanadium oxide, and zirconia.

8. The display substrate according to claim 1, wherein the first functional pattern has a thickness less than that of the second functional pattern.

9. The display substrate according to claim 1, wherein the sub-pixels comprise a red sub-pixel, a green sub-pixel and a blue sub-pixel, wherein a driving voltage of the red sub-pixel is higher than that of the green sub-pixel, and lower than that of the blue sub-pixel;
the display substrate further comprises a main hole transport layer formed between the organic light-emitting layer and the anode, and an auxiliary hole transport layer formed between the main hole transport layer and the anode;
the functional patterns are the auxiliary hole transport layer and comprise a first auxiliary hole transport layer corresponding to the red sub-pixel, a second auxiliary hole transport layer corresponding to the green sub-pixel, and a third auxiliary hole transport layer corresponding to the blue sub-pixel; and
the first auxiliary hole transport layer has a thickness greater than that of the third auxiliary hole transport layer, and less than that of the second auxiliary hole transport layer.

10. The display substrate according to claim 9, wherein the auxiliary hole transport layer has a thickness less than or equal to 50 Å.

11. The display substrate according to claim 10, wherein the display substrate further comprises a hole injection layer formed between the auxiliary hole transport layer and the anode, and a material doping concentration of the auxiliary hole transport layer is lower than that of the main hole transport layer or of the hole injection layer.

12. The display substrate according to claim 1, wherein a thickness and a doping concentration of the p-type material of each type of the functional pattern are simultaneously set so that the resistance value of each type of the functional pattern in the direction perpendicular to the organic light-emitting layer decreases as the driving voltage of the sub-pixel with the color corresponding to the type increases.

13. The display substrate according to claim 12, wherein the doping concentration of the p-type material of each type of the functional pattern is lower than or equal to 5% by weight, and the thickness of each type of the functional pattern is less than or equal to 50 Å.

14. A display panel, comprising the display substrate according to claim 1.

15. A display device, comprising the display panel according to claim 14.

16. The display device according to claim 15, wherein the resistance values of the first and second functional patterns in the direction perpendicular to the organic light-emitting layer are set so that a driving voltage actually applied to the first color sub-pixel is close to that actually applied to the second color sub-pixel.

17. The display device according to claim 15, wherein the sub-pixels comprise a red sub-pixel, a green sub-pixel and a blue sub-pixel, and a driving voltage of the red sub-pixel is higher than that of the green sub-pixel, and lower than that of the blue sub-pixel;
the functional patterns are p-doped hole injection layers formed between the organic light-emitting layer and the anode, and comprise a first p-doped hole injection layer corresponding to the red sub-pixel, a second p-doped hole injection layer corresponding to the green sub-pixel and a third p-doped hole injection layer corresponding to the blue sub-pixel; and
a material doping concentration of the first p-doped hole injection layer is lower than that of the third p-doped hole injection layer, and higher than that of the second p-doped hole injection layer.

18. The display device according to claim 17, wherein the material doping concentrations of the p-doped hole injection layers are less than or equal to 5% by weight.

19. A display substrate, comprising a base substrate and an anode, an organic light-emitting layer and a cathode formed on the base substrate sequentially,
wherein the display substrate further comprises a plurality of functional patterns formed between the organic light-emitting layer and the anode, the plurality of functional patterns is divided into different types based on colors of a plurality of sub-pixels, and each type of the plurality of functional patterns is disposed in a region of the sub-pixel with a color corresponding to the type;
wherein the plurality of sub-pixels with different colors has different driving voltages, and a resistance value of each type of the plurality of the functional patterns in a direction perpendicular to the organic light-emitting layer is controlled to decrease as the driving voltage of the sub-pixel with the color corresponding to the type increases; and
wherein the sub-pixels comprise a red sub-pixel, a green sub-pixel and a blue sub-pixel, and a driving voltage of the red sub-pixel is higher than that of the green sub-pixel, and lower than that of the blue sub-pixel;
the functional patterns are p-doped hole injection layers formed between the organic light-emitting layer and the anode, and comprise a first p-doped hole injection layer corresponding to the red sub-pixel, a second p-doped hole injection layer corresponding to the green sub-pixel and a third p-doped hole injection layer corresponding to the blue sub-pixel; and
a material doping concentration of the first p-doped hole injection layer is lower than that of the third p-doped hole injection layer, and higher than that of the second p-doped hole injection layer.

20. A display substrate, comprising a base substrate and an anode, an organic light-emitting layer and a cathode formed on the base substrate sequentially,
wherein the display substrate further comprises a plurality of functional patterns formed between the organic light-emitting layer and the anode, the plurality of functional patterns is divided into different types based on colors of a plurality of sub-pixels, and each type of the plurality of functional patterns is disposed in a region of the sub-pixel with a color corresponding to the type;
wherein the plurality of sub-pixels with different colors has different driving voltages, and a resistance value of each type of the plurality of the functional patterns in a direction perpendicular to the organic light-emitting layer is controlled to decrease as the driving voltage of the sub-pixel with the color corresponding to the type increases; and
wherein a thickness and a doping concentration of the p-type material of each type of the functional pattern are simultaneously set so that the resistance value of each type of the functional pattern in the direction perpendicular to the organic light-emitting layer decreases as the driving voltage of the sub-pixel with the color corresponding to the type increases.

* * * * *